(12) United States Patent
Kilian

(10) Patent No.: US 9,165,172 B2
(45) Date of Patent: Oct. 20, 2015

(54) RECEIVING DEVICE WITH RFID DETECTION OF BUILT-IN COMPONENTS HELD THEREIN, AND RFID DETECTION METHOD

(71) Applicant: Dieter Kilian, Olching (DE)

(72) Inventor: Dieter Kilian, Olching (DE)

(*) Notice: Subject to any disclaimer, the term of this patent is extended or adjusted under 35 U.S.C. 154(b) by 0 days.

(21) Appl. No.: 14/700,735

(22) Filed: Apr. 30, 2015

(65) Prior Publication Data

US 2015/0235067 A1    Aug. 20, 2015

Related U.S. Application Data

(63) Continuation of application No. 13/388,363, filed as application No. PCT/EP2009/005670 on Aug. 5, 2009, now Pat. No. 9,066,441.

(51) Int. Cl.
*H04Q 5/22* (2006.01)
*G08B 13/14* (2006.01)
*G06K 7/10* (2006.01)

(52) U.S. Cl.
CPC .................. *G06K 7/10425* (2013.01)

(58) Field of Classification Search
CPC .......................... H05K 7/1489; H05K 7/1498
USPC ........................................................ 340/10.1
See application file for complete search history.

(56) References Cited

U.S. PATENT DOCUMENTS

| | | | |
|---|---|---|---|
| 6,796,506 B1 * | 9/2004 | Pradhan et al. | 235/462.13 |
| 6,927,983 B1 * | 8/2005 | Beseth et al. | 361/796 |
| 7,071,825 B2 * | 7/2006 | VoBa | 340/572.1 |
| 7,436,303 B2 * | 10/2008 | Tourrilhes et al. | 340/572.1 |
| 7,628,409 B2 * | 12/2009 | Robbins et al. | 280/47.35 |
| 7,857,214 B2 * | 12/2010 | Saliaris | 235/383 |
| 2004/0178270 A1 | 9/2004 | Pradhan et al. | |
| 2006/0171538 A1 | 8/2006 | Larson et al. | |
| 2008/0114865 A1 * | 5/2008 | Rothman et al. | 709/223 |
| 2008/0265722 A1 | 10/2008 | Saliaris | |
| 2008/0272887 A1 * | 11/2008 | Brey et al. | 340/10.1 |
| 2009/0108995 A1 * | 4/2009 | Tucker et al. | 340/10.1 |
| 2009/0189767 A1 * | 7/2009 | Primm et al. | 340/572.1 |
| 2009/0195363 A1 | 8/2009 | Downie et al. | |

FOREIGN PATENT DOCUMENTS

DE    10 2007 034 437 A1    5/2008
WO        2009091888 A1    7/2009

* cited by examiner

*Primary Examiner* — Jennifer Mehmood
*Assistant Examiner* — John Mortell
(74) *Attorney, Agent, or Firm* — Pearne & Gordon LLP

(57) ABSTRACT

The invention relates to a receiving device, in particular a cabinet or rack, having a receiving space (12) for receiving built-in components (14) provided with RFID transponders (34), and having a detection device for detecting built-in components (14) accommodated, which is or can be connected to an evaluation device, and has at least one RFID antenna (32) for communication with the RFID transponders (34) of the incorporated built-in components (14). According to the invention, the receiving device (10) has a plurality of RFID transponders (36) arranged distributed along the receiving space (12), the transponder action of said RFID transponders can be changed as a function of a presence or absence of a built-in component (14) in the vicinity of the respective device-specific RFID transponder (36).

11 Claims, 8 Drawing Sheets

Figure 1:
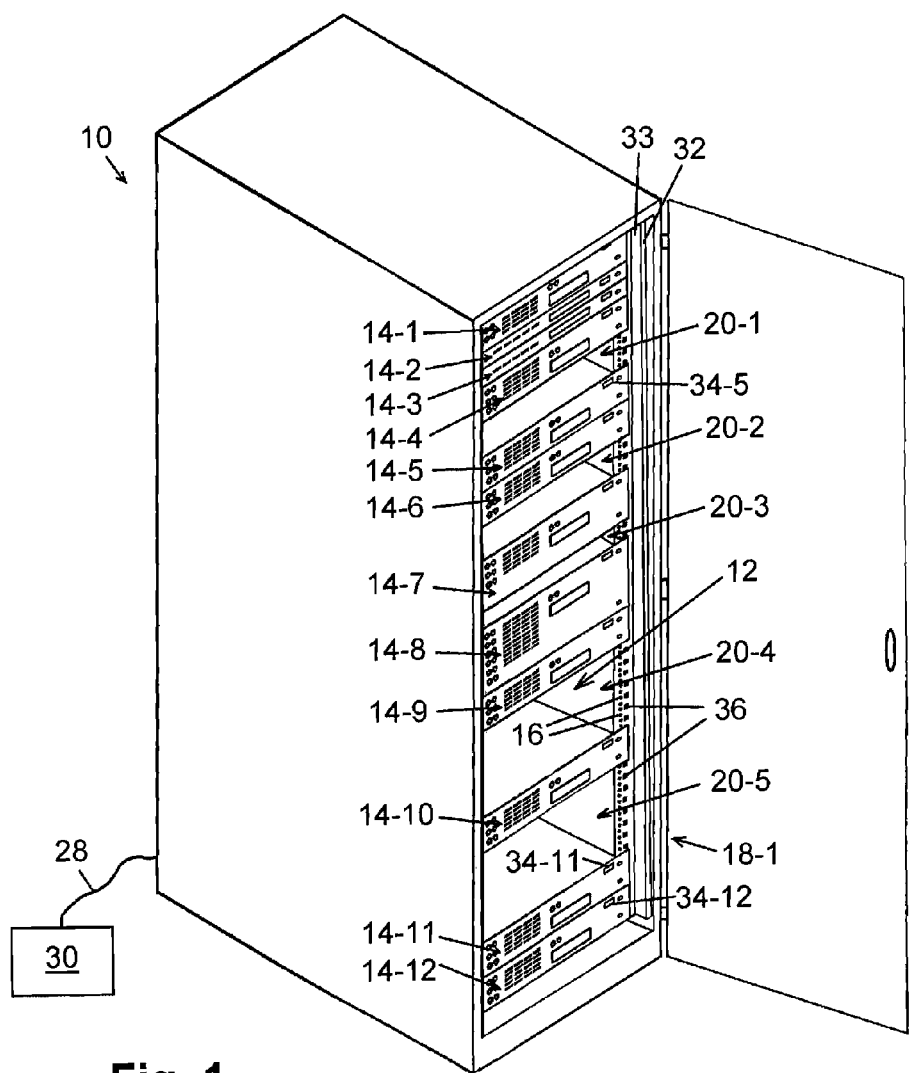

RECEIVING DEVICE WITH RFID DETECTION OF BUILT-IN COMPONENTS HELD THEREIN, AND RFID DETECTION METHOD

The invention relates to a receiving device for receiving built-in components according to the preamble of Claim 1.

Such a receiving device is known for example from DE 10 2007 034 437 A1 and comprises a receiving space for receiving built-in components and a detection device for detecting built-in components that are actually accommodated. The detection is based on so-called RFID technology and requires that the built-in components are each provided with an RFID transponder.

The RFID ("radio frequency identification") in general terms is a technique for the wireless identification of objects. An RFID system consists of at least one read device with at least one RFID antenna for reading data from RFID transponders within the range of the reader. The communication or data transfer between RFID transponder and read device takes place by means of electromagnetic waves. At lower frequencies this takes place inductively via the electromagnetic near field, at higher frequencies via the electromagnetic far field. The read device, and also the RFID transponder, can function both as a transmitter and a receiver of data to be transferred.

The detection device of the known receiving device is or can be connected to an evaluation device and comprises a plurality of RFID antennas arranged along the receiving space for short-range communication with the RFID transponders of the incorporated built-in components. It is therefore possible to identify different built-in components and to detect their presence or absence ("inventory creation"). By designing the detection device with a plurality of individual antennas each with a relatively short communication range, in addition to the detection of their mere presence, information relating to the positions of the built-in components held inside the receiving space can also be obtained.

Problems for the known receiving device however are presented by cases in which the precise arrangement of the RFID transponder on the individual built-in components is not exactly specified, and/or built-in components with different dimensions are incorporated into the receiving device. This is because In such cases, even from a precise knowledge of the position of a component-specific RFID transponder, it is not necessarily possible to deduce the exact dimensions and the exact installation position of the relevant built-in component.

It is an object of the present invention therefore to improve a receiving device of the above mentioned kind from the viewpoint of determining the position of the built-in components situated in the receiving space.

This object is achieved according to the invention by a receiving device according to claim 1. The dependent Claims relate to advantageous extensions of the invention.

The receiving device according to the invention comprises a plurality of plurality of RFID transponders arranged distributed along the receiving space, the transponder action of which can be changed as a function of a presence or absence of a built-in component in the vicinity of the respective RFID transponder.

In the RFID-detection system according to the invention therefore, not only do the built-in components each have an RFID transponder, hereafter also designated as a "component-specific RFID transponder", but additional RFID transponders are provided as part of the receiving device, which are therefore also designated hereafter as "device-specific RFID transponders".

Due to the fact that the device-specific transponders are arranged distributed along the receiving space and their transponder action can be changed as a function of a presence or absence of a built-in component in their vicinity, not only can the mere presence or absence of built-in components in the receiving space be detected by means of the detection device, but advantageously a detection of the installation positions within the receiving space is also facilitated with high accuracy.

The receiving device according to the invention can be in particular a cabinet or rack, for example an electrical cabinet or a switching cabinet for holding electrical or electronic built-in devices, or a so-called "IT rack" (e.g. "server rack") for holding electrical or electronic built-in devices for information technology (IT).

The term "rack" is intended here to designate a holding device by means of which a plurality of fairly small built-in components can be combined together to form a constructional unit ("occupied rack"). In this context a rack can be e. g. a stand or a frame which is appropriately implemented for the positioned holding and support of built-in components provided for this purpose.

The tern "cabinet" by contrast is intended to refer to a receiving device which, in the same way as a rack, is provided for receiving built-in components, but unlike a rack additionally comprises flat walls with which an inner space of the device at least to a large extent is enclosed (e.g. by side walls of the cabinet) or can be enclosed (e.g. by cabinet doors).

In a preferred embodiment it is provided that possible installation positions of the built-in components in the receiving space are provided by a "mounting grid" of the receiving device, in particular by a mounting grid which is defined by the positions of a series of fixing means constructed along an elongated, e.g. vertically extending, mounting frame part.

The term "grid" is intended here in general to mean a regular arrangement of grid points along a surface (surface grid) or along a line (linear grid). In a linear grid a regularity of the arrangement is present in particular when the grid points are arranged equidistantly along the line. A regular arrangement here, however, will also be used to designate an arrangement of grid points in which, quite generally, an arrangement pattern repeats itself with a particular periodicity. In this case the individual grid points, e.g. lying on a line, need not necessarily be equidistant to one another. Rather, a periodic repetition of specific mutual distances between the grid points is sufficient.

In a preferred embodiment, the possible mounting positions within the receiving space are defined by a linearly vertically extending mounting grid, which is defined by the positions of a series of fixing means, e.g. mounting holes, constructed along a vertically extended mounting frame part. In the case of a mounting grid which is defined by the positions (grid points) of fixing means, e.g. mounting holes, in order to mount a component this can be fixed (e.g. screwed) in the desired mounting position by means of at least one such fixing means.

In a preferred embodiment it is provided that the device-specific RFID transponders are arranged in a transponder grid extending along the receiving space, in particular in a transponder grid which is implemented so as to correspond to a mounting grid of the receiving device.

The implementation of the transponder grid "corresponding" to the mounting grid is intended to include e. g. the case that the two grids are identical or substantially identical (e.g. only slightly displaced relative to each other in the grid direction). In addition, a corresponding implementation will also be present when a period or periodic length of the one grid also represents a period or periodic length of the other grid.

Preferably, a transponder grid is provided which is suitable for the exact detection of the installation positions of the individual built-in components for any conceivable occupation situation of the receiving device.

In one embodiment it is provided that the at least one RFID antenna, which is provided in any case for communication with the component-specific RFID transponders, is also usable for communication with the device-specific RFID transponders.

Alternatively or in addition however, it can also be provided that the detection device has at least one additional RFID antenna for communication with the device-specific RFID transponders. This does, it is true, involve a certain amount of additional cost, but one which in some cases can be justified in terms of the detection reliability.

The "ability to change the transponder action" of the device-specific RFID transponders as a function of a presence or absence of a built-in component in the vicinity of the transponder, which is essential to the invention, can be implemented in a variety of ways. The corresponding technical implementation variants can be classified e.g. according to whether this change takes place automatically or forcibly during the installation or removal of a built-in component, or whether some action by a user (who carries out the installation or removal) is required. Both variants are possible within the scope of the invention.

"Change in the transponder action" is to be understood in the broadest sense as any such change which can be detected by an evaluation of the communication between the relevant RFID transponder and the antenna provided for this communication.

This detection can be based e.g. on the content of the communication (transferred data). To change the communication content as a function of a presence or absence of a built-in component, e.g. means for appropriately influencing the device-specific RFID transponders can be provided. Such influencing means can be formed by parts of the device and/or by parts of the built-in components and be e.g. electrically connected to an assigned transponder which can be provided for the purpose with e.g. electrical contacts (or cabling), via which the presence or absence is signalled (e.g. by short-circuiting of two electrical contacts on a transponder). In this manner, during installation or removal of built-in components, the transponder or transponders corresponding to the mounting position can be driven for a specific data transfer (to the RFID antenna).

In another embodiment this detection is based on the quality of the communication, or equivalently on the quality of the communication channel between transponder and antenna. As a particularly simple implementation variant of this, it can be provided that according to the presence or absence of a built-in component in the vicinity of the transponder, such a communication n the one case is significantly degraded or completely impossible in terms of radio coverage, whereas in the other case such a communication is enabled (in terms of radio coverage) or significantly improved.

For this purpose it can e.g. be provided that the communication is degraded or disabled in the presence of the built-in component and in the absence of the built-in component it is improved or simply enabled. A reverse assignment can also be equally well provided between the occupation situation in the vicinity of the transponder on the one hand and the communication quality on the other, however.

The above described change in the communication quality by the installation or removal of a built-in component can be implemented e.g. by a corresponding change in position of an electrically conductive region (with screening action) and/or a change in the distance between transponder and antenna and/or a change in orientation of the transponder with respect to the antenna.

The electrically conductive region mentioned can be provided as a part (e.g. a metallic region of the housing) of the relevant built-in component, or as a dedicated part specially provided for the purpose of occupation-dependent screening (e.g. a metallic screening plate). Such a screening part can e.g. represent an appropriately implemented component of the receiving device.

The change in distance between transponder and antenna mentioned above can be implemented e.g. by a translation and/or a pivoting of the transponder. Alternatively or in addition, such a translation and/or pivoting can also have the effect that the transponder is thereby moved into or out of a screened spatial area.

The change in orientation of the transponder with respect to the antenna mentioned above can be implemented e.g. by a pivoting or rotation of the transponder (with e.g. a stationary antenna).

According to another embodiment the above described change in the communication quality by the installation or removal of a built-in component be implemented by an electrical contacting of at least one section of an antenna of the relevant RFID transponder, in order to change the action of this antenna and therefore the transponder action in a detectable manner. For example, influencing means can be provided for this purpose, which electrically short circuit the end regions of an antenna configured as a dipole. In general such antenna sections can be contacted in a galvanically conducting manner during the mounting of built-in components, or wholly or partially covered by a screening part.

Since the action of an antenna usually crucially depends on the properties of the environment of the antenna, according to another embodiment, the action of the antenna and thus the transponder action can be influenced by targeted displacement of an "other than air" portion of the radio path between the RFID antenna and RFID transponder. For example, this can be effected e.g. by bringing an electrically conductive part towards or away from the antenna of the transponder. Thus, e.g. a change in the (antenna) resonance frequency or a detuning of the antenna can be produced. An action principle such as this could also be described as a radio screening (or release of screening) in the broadest sense. With regard to the configuration and arrangement of electrically conductive regions for this purpose (alternatively: e.g. regions with special (other than air) dielectric properties), reference is made to the explanations given here of the action principle of "screening".

In one embodiment it is provided that the change in the transponder action of the device-specific RFID transponders is effected forcibly by the mounting or demounting of a built-in component in the vicinity of the respective device-specific RFID transponder.

In a related extension it is provided that the quality of the communication path between the respective device-specific RFID transponder and an antenna, provided for the communication with this RFID transponder, is forcibly changed by the presence or absence of electrically conductive regions of the built-in component. In this case, to a certain extent an "electromagnetic action mechanism" is used for the communication change, which is based on the screening effect of electrically conductive regions for the RFID communication. In this case it can be alternatively or additionally provided that, due to the presence or absence of electrically conductive regions, it is essentially the antenna action of the relevant transponder which is actually changed.

Alternatively or additionally, it can be provided that the quality of the communication path between the respective device-specific RFID transponder and an antenna provided for the communication with this RFID transponder is changed, either by a manually performed or automatically controlled change in position of the respective device-specific RFID transponder.

Even in the case of a change in position of the respective RFID transponder an "electromagnetic action mechanism" is exploited, based e.g. on a change in a screening action (if the transponder is moved between spatial areas which are "differently illuminated" in terms of radio coverage), and/or based on a change in the signal strength of the RFID communication, which is already determined by the physical-principle-based dependence of the signal strength on the distance between transponder and antenna, and/or based on a change in the signal strength due to a directional effect and/or polarisation effect (if antenna and/or transponder have direction-dependent or polarisation-dependent transmission and/or reception properties with respect to the electromagnetic RFID radiation).

In one embodiment, means for causing the change in the transponder action which can be manually operated by a user are provided. For this purpose, such means as e.g. buttons, sliders, flaps, rotary knobs or the like which are manually activatable by the user before, during or after an installation or removal of a built-in component, come into consideration as "operating devices", by the manual activation of which the change in the transponder action is effected. Any such operating device can be connected e.g. directly or indirectly via a mechanical functional connection (gears, linkage or the like), to an assigned transponder in order to selectively displace this during the manual operation. Alternatively or additionally to a displacement of the assigned transponder, in this case a displacement of another assigned part, e.g. a screening plate, can also be provided.

For example, it can be provided that a change in the quality of the communication or quality of the communication path between antenna and transponder is induced by means of such a manual operation, as has already been described above.

For example, for each device-specific RFID transponder an electrically conductive screening part (e.g. a screening plate made of metal) can be directly or indirectly moved by the user in such a manner that the communication quality is thereby changed, as described above. The screening part can be e.g. shifted and/or pivoted and/or rotated. This operating action is to be performed by the user when he installs or removes a built-in component.

Also, e.g. as already stated above for automatic or forcible changes in the transponder action, various action mechanisms, individually or combined, can also be provided for manually changing the transponder action, such as action mechanisms based on a change of distance and/or a change in orientation between transponder and antenna.

During such an operation the user can e.g. directly touch a screening part or the transponder, or a part carrying the transponder, and change its position (e.g. displace and/or rotate it). Alternatively, e.g. an only indirect change in position can be provided, which takes place by means of a mechanism which is functionally arranged between an operating element and the part whose position is to be changed (e.g. transponder or screening part).

According to a further aspect of the present invention an RFID detection method is provided which is executed by means of a receiving device of the above described type. Such an RFID detection method facilitates an automatic inventory to be taken of the incorporated built-in components.

According to a preferred extension it is provided that, in the area of the evaluation device or of a data processing device connected thereto, current information about the occupation of the receiving device with built-in components is stored and automatically updated by means of the RFID detection.

When the receiving device has a specific occupation with built-in components at a specific time point, which is stored in electronic form, then this situation corresponds to a particular "RFID receive situation", i.e. identifications of the RFID transponders of the incorporated built-in components are detected and in addition, identifications of device-specific RFID transponders corresponding to the occupied (or unoccupied) sections of the receiving space are detected. If, starting from this situation a built-in component is now demounted, then firstly, it can be detected which component is involved, because with the removal of the built-in component the corresponding identification of the component-specific RFID transponder is then no longer detected. Secondly however, it can also be determined exactly which section of the receiving space becomes free due to this demounting, and namely in two ways, which can be implemented e.g. in parallel: Firstly, the information about the freed section of the receiving space is already available from the stored occupation plan, which indicates for each built-in component the receiving space section which is thereby occupied. Secondly however, the freed receiving space section can also be determined from the change in the transponder action of one or more device-specific RFID transponders, which is associated with the removal of the built-in component. In the converse case, when an additional built-in component is installed, then by detecting the identification of the thereby newly added component-specific RFID transponder, it can be determined which built-in component is involved. Its installation position or the receiving space section occupied by this component can again be determined by means of the change in the transponder action of one or more device-specific RFID transponders. By means of the RFID detection therefore, the stored occupation plan can be continuously monitored and updated. This preferably takes place in a computer program, e.g. in a data processing device which is connected to the evaluation device for the purpose (or assumes its function) and on which appropriate "inventory-taking software" runs.

Figure 2:
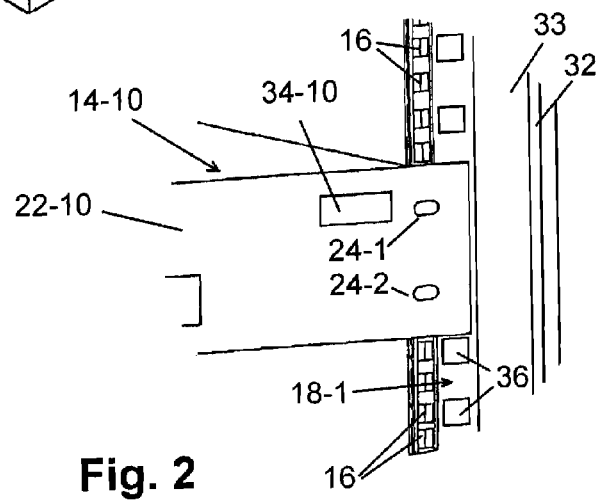
Figure 3:
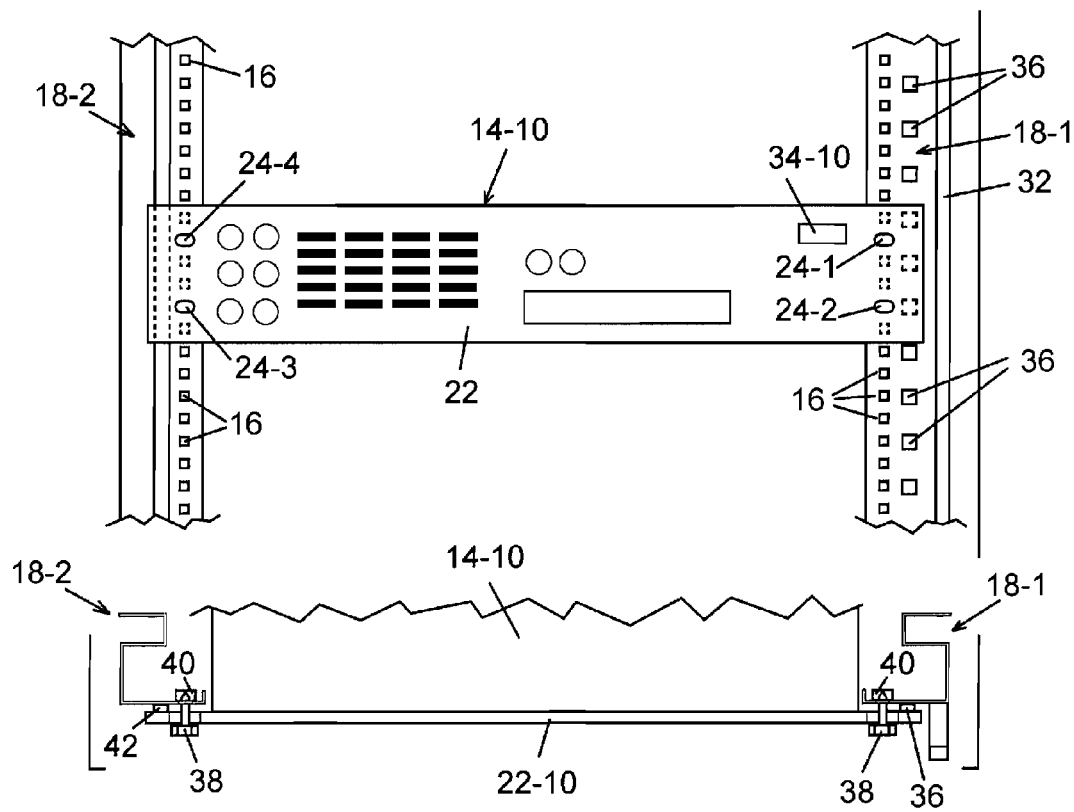
Figure 4:
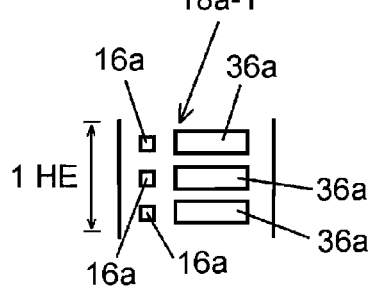
Figure 5:
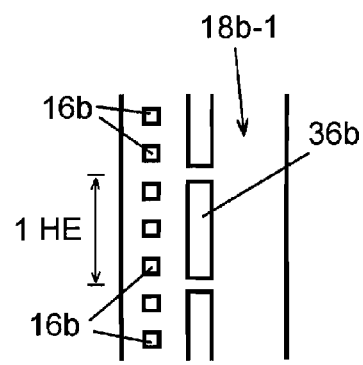
Figure 6:
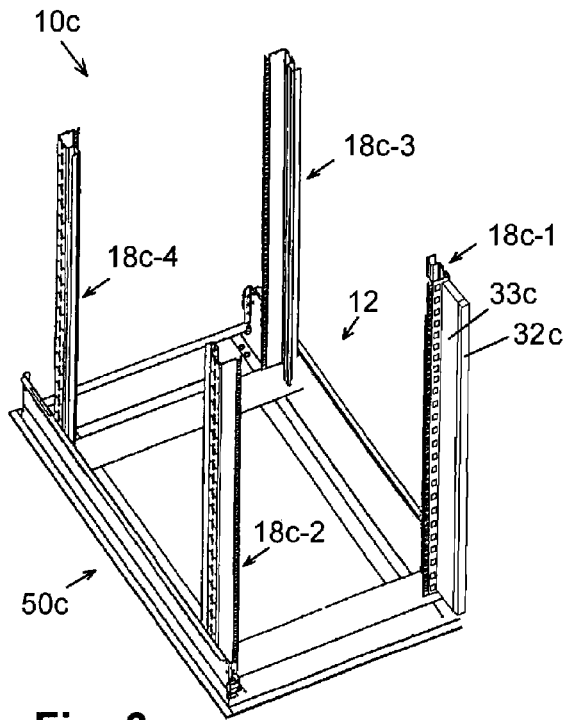
Figure 7:
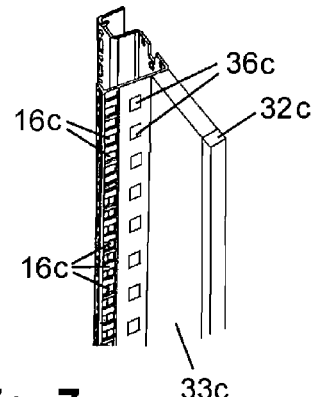
Figure 8:
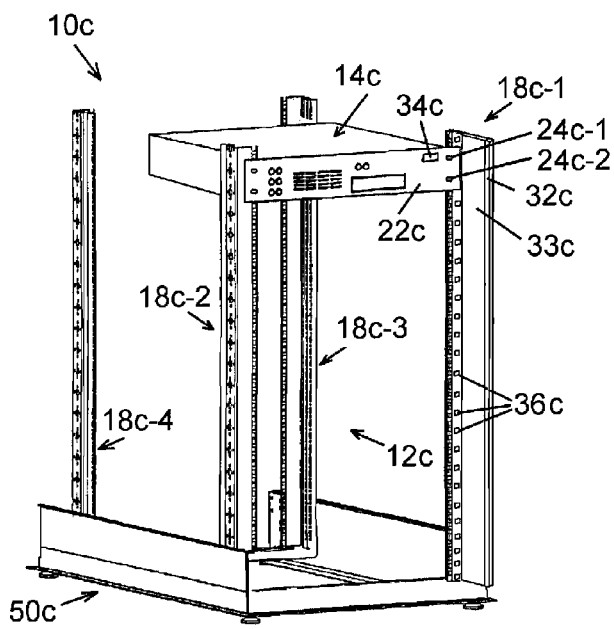
Figure 9:
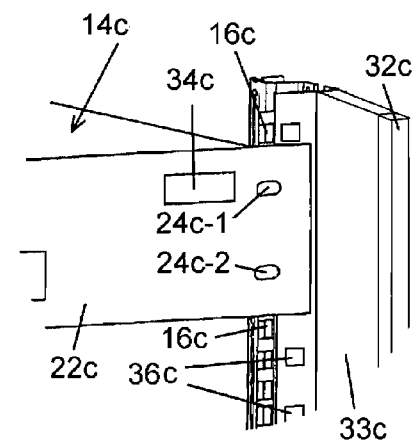
Figure 10:
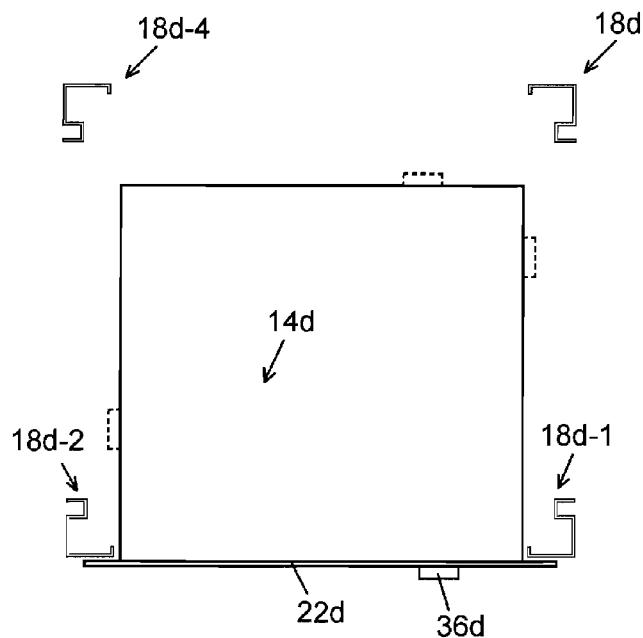
Figure 11:
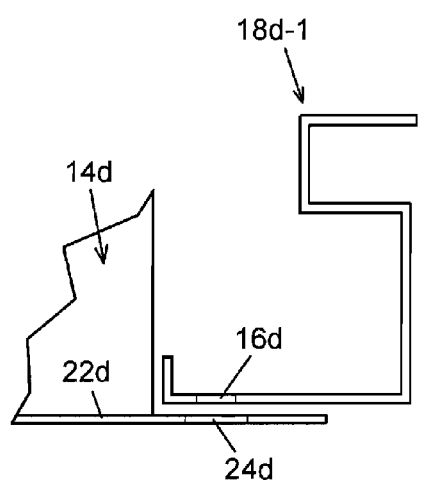
Figure 12:
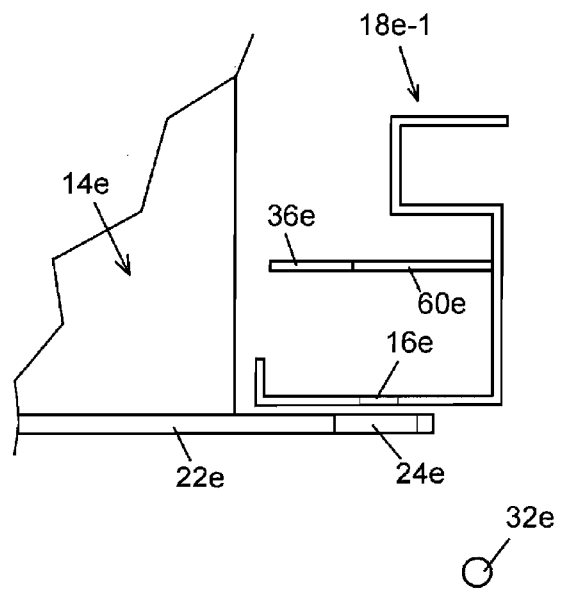
Figure 13:
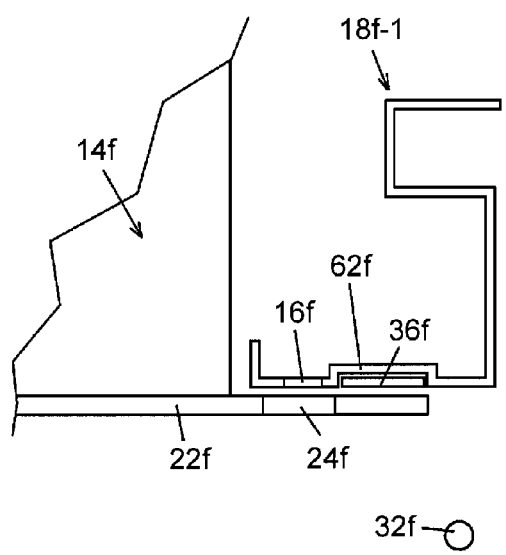
Figure 14:
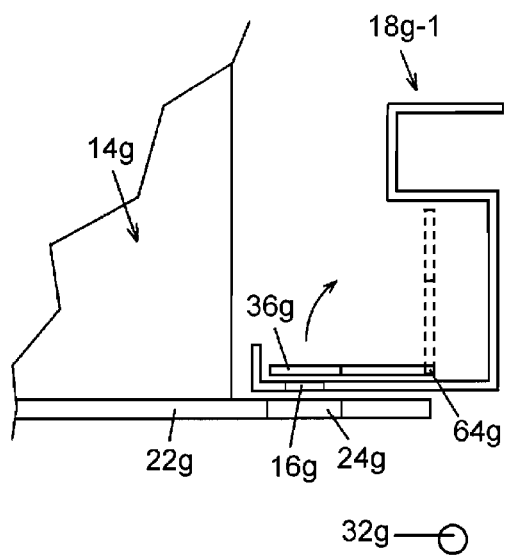
Figure 15:
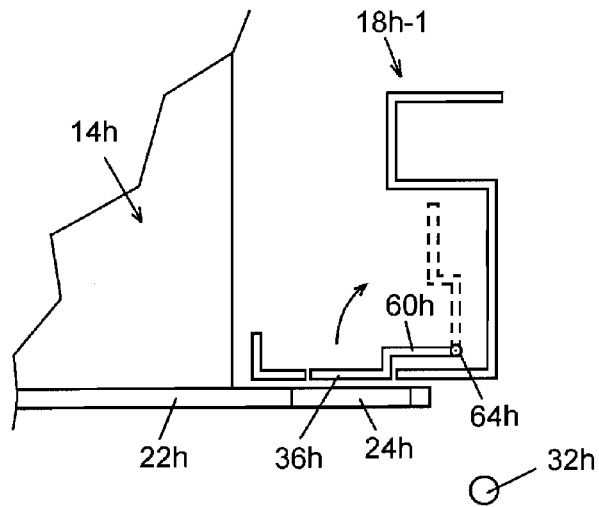
Figure 16:
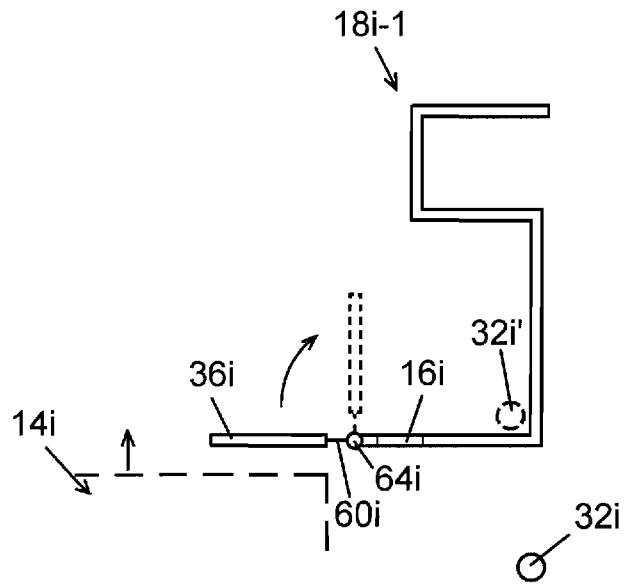
Figure 17:
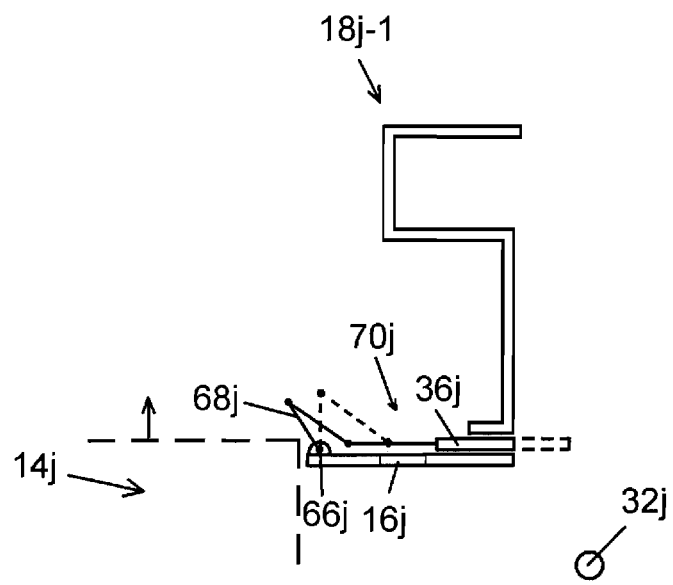
Figure 18:
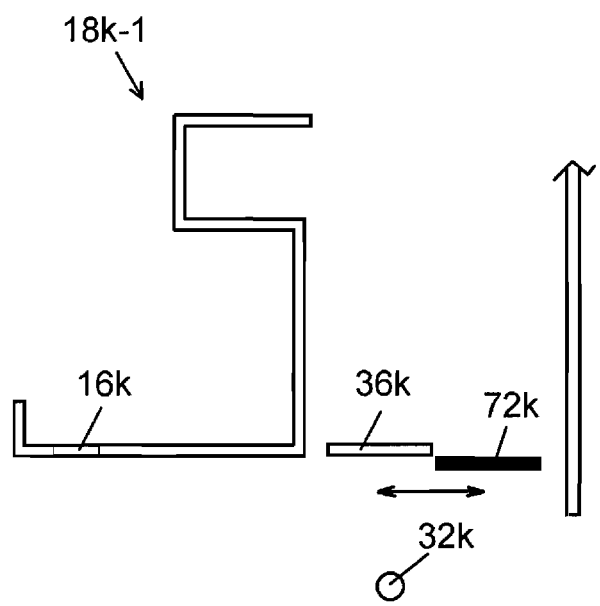
Figure 19:
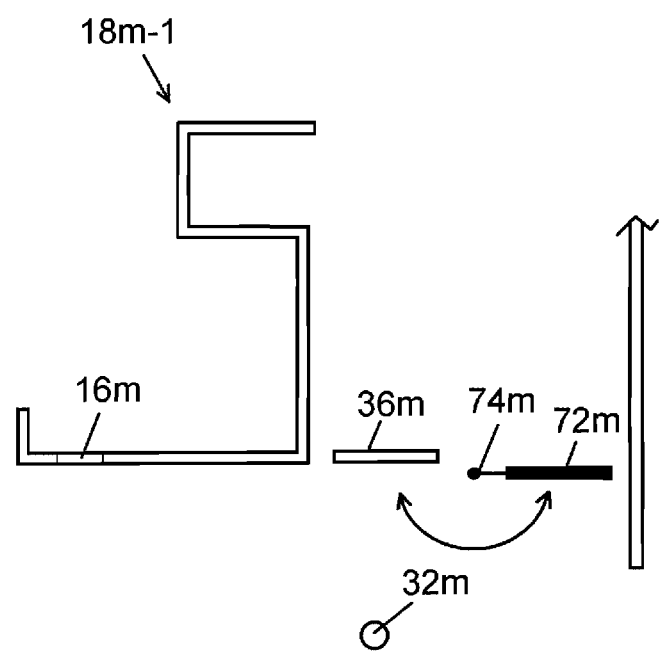
Figure 20:
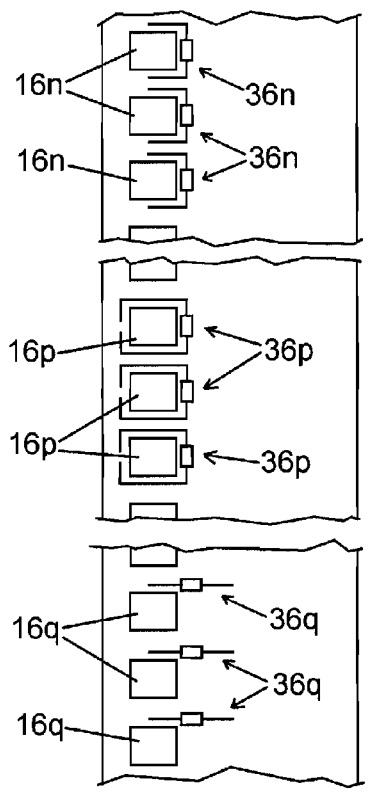
Figure 21:
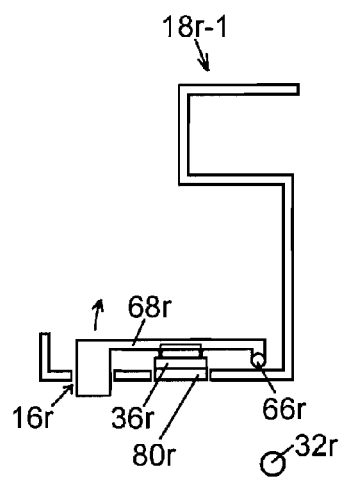
Figure 22:
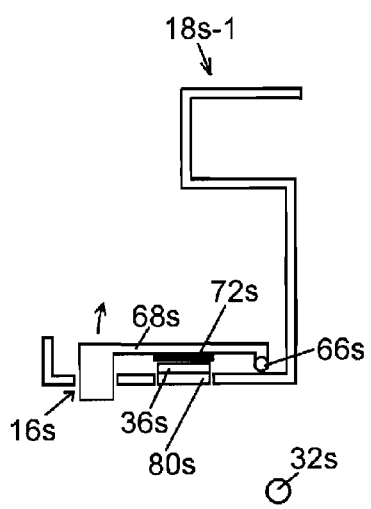

The invention is hereafter described in further detail, making use of exemplary embodiments and with reference to the accompanying drawings. Shown are:

FIG. 1 a perspective view of a receiving device (switching cabinet) according to a first exemplary embodiment, FIG. 2 a detail from FIG. 1, FIG. 3 a schematic front view and a schematic plan view of a detail of the receiving device of FIG. 1, FIG. 4 a schematic illustration of a detail of FIG. 3 in a variant form, FIG. 5 a schematic illustration of a detail of FIG. 3 in a variant form, FIG. 6 a perspective partial view of essential components of a receiving device (IT rack) according to a second exemplary embodiment, FIG. 7 a detail from FIG. 6, FIG. 8 a view similar to FIG. 6, but illustrating a built-in component positioned therein, FIG. 9 a detail from FIG. 8, FIG. 10 a schematic plan view of a positioned built-in component, FIG. 11 a detail from FIG. 10, FIG. 12 a view corresponding to FIG. 11 according to a variant, additional exemplary embodiment, FIG. 13 an illustration corresponding to FIG. 11 of a further exemplary embodiment, FIG. 14 an illustration corresponding to FIG. 11 of a further exemplary embodiment, FIG. 15 an illustration corresponding to FIG. 11 of a further exemplary embodiment, FIG. 16 an illustration corresponding to FIG. 11 of a further exemplary embodiment, FIG. 17 an illustration corresponding to FIG. 11 of a further exemplary embodiment, FIG. 18 an illustration corresponding to FIG. 11 of a further exemplary embodiment, FIG. 19 an illustration corresponding to FIG. 11 of a further exemplary embodiment, FIG. 20 an to illustration corresponding to FIGS. 4 and 5 of various transponder arrangements, FIG. 21 an illustration corresponding to FIG. 11 of a further exemplary embodiment, and FIG. 22 an illustration corresponding to FIG. 11 of a further exemplary embodiment, FIG. 1 shows a receiving device 10 embodied as a so-called electrical cabinet or switching cabinet, having a receiving space 12 for receiving built-in components 14 provided with RFID transponders 34.

The reference numbers of components provided multiple times in one embodiment, but which are analogous in their action, such as the "built-in components 14" or the "RFID transponder 34", are mostly consecutively numbered (in each case supplemented by a hyphen and a sequential number). Individual such components or the entirety of such components are also referred to in this text by the incomplete reference number.

The built-in components 14 are in the example illustrated electrical and/or electronic devices or built-in devices, the dimensions of which are adapted to suit the design of the device 10, or its receiving space 12. In this respect the device 10 can be e.g. a switching cabinet implemented according to a specific standard, such as a so-called "19-inch switching cabinet", for example for receiving built-in devices (e.g. servers) from information technology (IT).

Possible mounting positions of the built-in components 14 in the receiving space 12 are specified in a manner known per se by a mounting grid which is defined by the positions of fixing holes 16 constructed along elongated, vertically extending mounting frame parts 18-1 to 18-4 ("perforated strips").

In FIGS. 1 and 2 only one of these mounting frame parts 18 can be identified, namely a right-hand frontal mounting frame part 18-1. Together with the other mounting frame parts 18-2 to 18-4 extending vertically parallel thereto (left front, right rear, left rear) the essentially parallelipipedal receiving space 12 is implemented to accommodate the built-in components 14.

In the situation illustrated the receiving device 10 is populated with a total of 12 built-in components 14-1 to 14-12, of which the components 14-2 and 14-3 have a relatively small installation height of one so-called "height unit" (HE), the components 14-7 and 14-8 a relatively large installation height of 3 HE or 4 HE and the remaining components have an installation height of 2 HE.

The exact height positioning of each component 14 in the receiving space 12 can be specified in the example shown at exactly ⅓ HE. The mounting grid defined by the vertical series of fixing holes 16 is appropriately designed to suit this (mean hole separation=⅓ HE).

In the situation shown, free receiving space sections 20-1 to 20-5 can be identified, which provide space for accommodating further built-in components, or in practice when not in use are normally closed off at the front with blanking plates (not shown). Such blanking plates can also represent "built-in components" in the sense of the invention, i.e. each can be provided with an RFID transponder to be identified. The installation of such blanking plates is of great advantage or even essential in many applications, e.g. when the receiving space is air-conditioned (actively cooled). To this extent the inclusion of the blanking plates in the detection when determining the current occupation situation of the receiving device is often an advantage. As in the case of the built-in components 14 themselves, the free receiving space sections 20 can also vary in terms of their height (in steps of ⅓ HE).

As is illustrated in FIG. 2 by the example of the built-in component 14-10, the fixing of the built-in components 14 takes place by screwing a front plate 22 of the relevant built-in component onto the front mounting frame parts 18-1 and 18-2. For this purpose, each front plate 22 has on both lateral ends at least one fixing hole 24, which during mounting can be aligned with one of the fixing holes 16 in order to fix the built-in component by a screw fitting. In the example of FIG. 2 shown, the front plate 22-10 of the built-in component 14-10 has four fixing holes altogether (2 on the left, 2 on the right), of which the two right-hand ones are visible and labelled with 24-1 and 24-2.

A special feature of the receiving device 10 consists in the fact that it is provided with a detection device for the detection of currently incorporated built-in components 14. The detection device is connected via a cable link 28 to an evaluation device 30, arranged externally in this example, in order to facilitate an automatic "inventory creation" of the contents of the receiving device 10. The cable link 28 can be implemented e.g. via a plug connection arranged on the outside of the device 10. Another conceivable alternative is a wireless data transfer connection between the device 10 and the evaluation device 30 (or a data processing device).

The acquisition of the switching cabinet inventory is effected by means of RFID. The detection device comprises at least one RFID antenna for this purpose, for communication with RFID transponders 34, with which the individual built-in components 14 are each provided. In the exemplary embodiment illustrated, an RFID antenna 32 (e.g. a "patch antenna") is provided, extending longitudinally in the vertical direction, which is attached (e.g. by means of adhesive) onto the front face of the mounting frame part 18-1, on a spacing strip (dielectric) 33. Alternatively, the antenna 32 could be arranged at another point in or in the vicinity of the receiving space, e.g. on the inside of the cabinet door (cf. FIG. 1). The detection device in the illustrated example consists of the antenna 32 and an antenna lead connected thereto and leading to the cable link 28. Alternatively, e.g. an additional antenna amplifier could be accommodated in the device 10.

FIG. 2 further illustrates the arrangement of the REID transponder 34-10 on the front face of the front plate 22-10 of the built-in component 14-10. The remaining built-in components 14 are each also provided with such a component-specific RFID transponder 34, which in the example illustrated is in each case glued onto the front of the front plate 22.

The use of component-specific RFID transponders 34 and the arrangement of the RFID antenna 32 for communication with these transponders already facilitates a "rough inventory creation", such that in the region of the evaluation device 30, information about the number and respective type of built-in components 14 currently accommodated in the receiving space 12 can be obtained. For this purpose, each component-specific RFID transponder 34 stores, in a manner known per se, corresponding data about the relevant built-in component 14.

Furthermore however, the RFID detection integrated into the device 10 in the example illustrated also enables information to be obtained about the respective mounting positions of the built-in components 14 in the receiving space 12. A "more exact inventory" is therefore possible, to the extent that in the region of the evaluation device 30 (and any data processing device connected thereto), the information on a more or less accurate "occupation plan" of the receiving device 10 exists, from which e.g. it can also advantageously be inferred at exactly which positions the free receiving space sections 20 are present, and what height each of these has. Based on such information it can be established, e.g., whether or not sufficient "height units" are still free in the receiving space 12 for installing a particular built-in component of a predefined installation height, and if this is the case, whether the installation is straightforwardly possible (without reconfiguring already installed components in terms of their mounting positions).

In order to facilitate such more accurate inventory taking, the receiving device 10 has a plurality of (device-specific) RFID transponders 36 arranged distributed along the receiving space 12, the transponder action of which can be changed as a function of a presence or absence of a built-in component in the immediate vicinity of the respective device-specific RFID transponder 36.

In the illustrated exemplary embodiment these device-specific RFID transponders 36 are arranged on the front face of the mounting frame part 18-1 such that whenever a built-in component 14 is installed, one or more of these RFID transponders 36 must inevitably be covered by the front plate 22 of the relevant built-in component 14 and therefore electromagnetically screened. An RFID antenna provided for communication with these transponders 36, in the illustrated exemplary embodiment the RFID antenna 32, can therefore no longer detect the electromagnetically screened off transponders. At the same time however, the mounting of the relevant built-in component 14 can be detected by means of the component-specific RFID transponder 34 attached thereto. By evaluation of the RFID detection results therefore, it can be easily determined which type of, or which built-in component 14, has been installed in which position inside the receiving space 12.

In the present example the device-specific RFID transponders 36 are arranged on a "transponder grid" extending along the receiving space 12, which is implemented so as to correspond to the mounting grid of the receiving device 10. The mounting grid is defined by the vertical arrangement of the fixing holes 16, the mean mutual spacing of which has the value ⅓ HE. The transponder grid consists of a corresponding vertical series of transponder positions, the mean mutual spacing of which has the value ⅔ HE. The individual device-specific transponders 36 in the illustrated example are each arranged adjacent to one of the fixing holes 16, wherein however a device-specific transponder 36 is also arranged adjacent only to every second fixing hole 16.

Although in the receiving device 10 the RFID antenna 32 provided for communication with the component-specific RFID transponders 34 is also used for communication with the device-specific RFID transponders 36, then as an alternative, a further RFID antenna could also be provided for communication with the device-specific RFID transponders 36. The most convenient arrangement of one or more RFID antennas depends e.g. on the positions of the built-in components at which the component-specific RFID transponders are arranged. In particular when no specifications exist with regard to the arrangement of the component-specific RFID transponders, then an arrangement of a plurality of RFID antennas (e.g. in every corner of the cabinet and/or on more than one sides of the cabinet) is advantageous, by means of which all possible component-specific RFID transponders can always be reliably detected independently of their specific arrangement.

FIG. 3 illustrates, again in schematic views from the front and from above, the mounting situation already partially visible in FIG. 2, using the example of the built-in component 14-10.

The upper part of the Figure shows once again the vertical extent of the mounting grid, which is defined by the mounting frame parts 18-1 and 18-2, implemented as perforated strip profiles, with the fixing holes 16.

The lower part of the Figure shows more clearly the nature of the mounting of the built-in component 14-10 by means of a screw connection of its front plate 22-10 to the mounting frame parts 18-1, 18-2 (screws 38 and nuts 40). In particular if the device-specific RFID transponders 36 on the mounting frame part 18-1 have a significant thickness, then it is convenient if, as shown, the front face of the left-hand mounting frame part 18-2 is provided with a corresponding spacer 42 (e.g. formed as a continuous strip or from individual spacing pieces), in order to prevent an otherwise "lopsided" mounting of the front plate 22-10 and therefore of the built-in component 14-10. For this purpose the spacing piece or pieces 42 in the design illustrated must have the same thickness as the transponders 36.

In order also to guarantee a correct mounting position of the built-in component without the arrangement of such a spacer, options to be considered are e.g. a suitable protrusion of the front left-hand mounting frame part or the embodiment variant to be described below with reference to FIG. 13.

In the above described example, the mounting position of a 1-HE built-in component 14 can be detected exactly, because for all the different conceivable mounting positions each one results in distinguishable RFID detection results. In a corresponding manner, when a 1-HE built-in component 14 is demounted, exact information can be obtained as to which section of the receiving space 12 is thereby released. These embodiments of the mounting grid and the transponder grid are of course only to be regarded as examples. What is particularly interesting In practice is e.g. a modified design of the transponder grid, such that an exact detection (exact to a "sub-division" (here e.g. ⅓ HE) of the mounting grid) is facilitated for all types and heights of built-in components from a given "range" of possible built-in components. (This is achieved by e.g. the transponder grid illustrated in FIG. 4 with "finer partitioning").

In the above described example the device-specific RFID transponders 36 are arranged as described, such that when mounting a component 14 (e.g. electronic device or blanking plate) one part of these transponders is concealed (screened off) in each case. A suitable arrangement of the transponders 36 can be easily planned or implemented in particular if the relevant range of mountable components 14 involves standardised components (e.g. for a conventional "19-inch mounting rack"). If however the front plate of a built-in component as such would not conceal the relevant transponder or transponders 36, a sideways extension of the front plate (here serving as a screening plate, with a height extension equal to that of the component itself) can also be additionally screwed in place, in order to guarantee the proper transponder concealment.

In the following description of other exemplary embodiments, identical reference numbers are used for components with equivalent function, in each case modified by a small letter to distinguish the embodiment. This section will essentially only deal with the differences relative to the already described exemplary embodiment or embodiments, and in any case reference is hereby expressly made to the description of previous exemplary embodiments.

FIGS. 4 and 5 illustrate examples of two modifications of a transponder grid formed by the device-specific RFID transponders, which can be used e.g. in the receiving device 10 according to FIGS. 1 to 3.

Thus in FIG. 4 a transponder grid is shown in which for every fixing hole 16a of a mounting frame part 18a-1, a device-specific RFID transponder 36a is present in an adjacent position.

The use of such a finer transponder grid as according to FIG. 4 in the receiving device 10 according to FIGS. 1 to 3 facilitates in a particularly advantageous manner an exact detection of the mounting positions (or demounting positions) of all types of built-in components from the relevant built-in component range (here: e.g. 1-, 2-, 3- and 4-HE built-in components). This is because for all different conceivable mounting positions (or demounting positions), distinguishable RFID-detection results are obtained in each case. As part of an inventory creation process therefore, exact information can be obtained as to which built-in components are situated precisely where in the receiving space (accurate to ⅓ HE).

FIG. 5 illustrates, by contrast, a coarser transponder grid formed of transponders 36b on a mounting frame part 18b-1. The transponders 36b in this example each extend over the vertical extent of three adjacent fixing holes 16b. An occupation plan determined or updated as part of an RFID detection method would therefore be correspondingly coarser.

Deviating from the arrangement positions of the transponders 36a or 36b illustrated in FIGS. 4 and 5, instead of next to the hole grid row 16a or 16b, these could also be arranged in the gaps between the individual fixing holes 16a or 16b (for which transponders of appropriately small dimensions are advantageous).

In each of the examples of transponder grids described thus far, only one of the two frontal mounting frame parts (right-hand front mounting frame part 18-1, 18a-1 or 18b-1) was used for the mounting or integration of the device-specific RFID transponders.

Alternatively or additionally however, it is also possible e.g. to provide device-specific RFID transponders on the other of the two front mounting frame parts (and/or any another of the mounting frame parts that may be present).

It is also possible to arrange the transponders to use a strip specially provided for the purpose and/or to use a strip which is present in any case, e.g. as a mechanical stabilising part.

A plurality of transponder arrangements (e.g. on a plurality of strips, in particular strips extending parallel to one another) can be advantageous, e.g. for a detection redundancy, for which a transponder can be arranged e.g. at the same position of two strips or mounting frame parts (e.g. the two mounting frame parts arranged at the front left and right). Transponder arrangements of this kind on the two frontal mounting frame parts (or other strips) can also be provided differently from one another in terms of position (e.g. in terms of height). This is of interest e.g. for an embodiment in which the transponder array is to have a high resolution (grid pattern), but this is not allowed by the (e.g. vertical) extent of the transponders used along a single mounting frame part or strip. In this case an "interlaced arrangement" can be provided, such that on each of the strips or mounting frame parts used for the transponder arrangement, an (e.g. vertical) row of (e.g. "tightly packed") transponders is arranged, but wherein the multiple transponder rows are offset relative to one another. When arranging two rows of transponders these can be offset by e.g. half of an (e.g. vertical) transponder distance relative to one another.

In the above described exemplary embodiments, the detection of the position of an installed or just demounted built-in component 14 is based on the fact that the communication path between the relevant device-specific RFID transponders and an antenna provided for the communication with these RFID transponders is necessarily interrupted, or enabled again, by a section of the relevant front plate during the installation or removal. This front plate area, due to its electrically conductive (e.g. metallic) construction, has a screening action (in terms of radio signals). The communication between transponder and antenna, in the case of a built-in component in the vicinity in the example described, is completely disabled.

Deviating from this action mechanism, e.g. other electrically conductive regions of the built-in components (e.g. parts of a metallic housing) can also be used for this screening effect, in order to facilitate the position detection.

FIGS. 6 to 9 illustrate a further exemplary embodiment of a receiving device 10c, which is implemented as a so-called "rack".

Apart from the outer walls which are not present in this device 10, the device 10c corresponds in structure and function essentially to the exemplary embodiment already previously described with reference to FIGS. 1 to 3.

In the illustrations of FIGS. 6 and 8, as well as partially illustrated, vertically projecting mounting frame parts 18c-1 to 18c-4, a rectangular frame base 50c is also shown, on which the lower ends of the mounting frame parts 18c are fixed in place. The upper ends (not shown) of the mounting frame parts 18c are also stabilised in their reciprocal position by a corresponding end frame.

FIG. 10 shows an example using a built-in component 14d of a mounting situation, such as can be present e.g. in a receiving device of one of the types already described above (cabinet, rack or the like).

The built-in component 14d (as also an entire receiving space 12d available for the mounting of such components) is again bounded at the sides by a total of four mounting frame parts 18d-1 to 18d-4.

If, as shown, a fixing of the built-in component 14d is only provided onto the front mounting frame parts 18d-1, 18d-2, then to provide mechanical support for the component 14d lateral support plates (not shown) can be installed, on which the lateral lower regions of the component 14d rest and which each extend horizontally between the mounting frame parts 18d-1 and 18d-3 or 18d-2 and 18d-4. Such support plates can be e.g. screwed onto the mounting frame parts, like the relevant component 14d.

Examples of alternative sites for mounting a component-specific RFID transponder are shown dashed in FIG. 10.

For the cross-sectional design of the mounting frame parts 18d-1 to 18d-4, numerous possibilities are available. In FIG. 11 a specific cross-sectional design is shown merely as an example. This cross-sectional example is also used as the basis of the subsequent description of further exemplary embodiments. Naturally however, other cross-sectional designs are also possible in all exemplary embodiments.

Each of FIGS. 12 to 19 illustrates, in a view corresponding to that of FIG. 11, various modifications which can be provided on a receiving device of the type already described with regard to the nature of the arrangement of device-specific RFID transponders.

When in these exemplary embodiments described below a or the device-specific RFID transponder is mentioned, then this relates to the respective transponder illustrated in the drawing. As in the receiving devices already described, in actual fact a plurality of such transponders is arranged on a vertical transponder grid in each case. However, since the individual transponders of each exemplary embodiment are arranged or mounted in the same manner (e.g. on rotating or sliding bearings), offset relative to one another only in the vertical direction, their description is redundant.

FIG. 12 shows an exemplary embodiment in which a mounting frame part 18e-1 is not provided with a device-specific RFID transponder 36e on its front face, but behind it.

The transponder 36e is stationarily attached to the mounting frame part 18e-1 via a retaining section 60e. The section 60e can form an integral part of the mounting frame part 18e-1 which is implemented as a profile, or be implemented as a separate component.

When a built-in component 14e is positioned as shown in the vicinity of the transponder 36e, then the front plate 22e of the built-in component 14e again has the effect of screening the transponder 36e from an RFID antenna 32e assigned thereto. After demounting the component 14e a communication between the antenna 32e and the transponder 36e can be made "through the fixing hole 16e". As shown, when the component 14e is demounted a "line-of-sight connection" for radio signals exists between antenna 32e and transponder 36e.

It is to be noted that also in the case in which the fixing hole 16e is aligned with a fixing hole 24e on the front plate 22e, this screening occurs in the mounted condition of the component 14e, due namely to the screw fixing that is present at this position (by means of a screening screw and nut).

The transponder 36e in the illustrated exemplary embodiment is arranged at the same height as the fixing hole 16e shown, but at a horizontal distance from it which allows a trouble-free screw fixing of the front plate 22e.

FIG. 13 shows an exemplary embodiment similar to those already described above with reference to FIGS. 1 to 3 and 6 to 9. In particular in the example according to FIG. 13, a transponder 36f is again arranged on the front face of a mounting frame part 18f-1. This is in a recess 62f however, the depth of which approximately corresponds to the thickness of the transponder 36f, so that the transponder 36f does not prevent a front plate 22f of a built-in component 14f from areally resting on the front face of the mounting frame part 18f-1. The recess 62f can be implemented, e.g. as shown, by an appropriate shape configuration of the mounting frame profile 18f-1. Alternatively, the profile 18f-1 could have e.g. a continuous recess (through hole) passing through it (from the front to the rear face), into which the individual transponders 36f or a strip carrying them (e.g. plastic strips) are/is inserted (similar to the recess as described for the examples according to FIGS. 21 and 22).

In the exemplary embodiments described up to now the device-specific RFID transponders are arranged stationarily inside the receiving device. Below, with reference to FIG. 14 to 17, exemplary embodiments with displaceable transponders will be explained. The idea underlying these exemplary embodiments is to change the quality of the communication path between the respective device-specific RFID transponder and an antenna provided for the communication with this RFID transponder when a built-in component is mounted or demounted, by means of a forcibly controlled (alternatively: manually invoked) change in the position of the respective device-specific transponder.

FIG. 14 shows an exemplary embodiment of a mounting frame part 18g-1 having an RFID transponder 36g, which is attached to the mounting frame part 18g-1 via a pivotable retaining section 60g.

If no built-in component is present in the vicinity of the transponder 36g, then a "line-of-sight connection" for radio signals exists between transponder 36g and an associated RFID antenna 32g. If a built-in component is mounted at this position however, then a screening is provided by the front plate, or a forcibly controlled pivoting of the transponder 36g about a vertical pivoting axis 64g, during which the transponder 36g is moved into the position shown by a dashed line, in which the RFID communication with the antenna 32g is disabled. This is because in the position shown by a dashed line the transponder 36g is situated in a spatial region which is barely "illuminated" by the antenna, or not at all, and which is screened by the e.g. metallic mounting frame part 18g-1.

A simple possibility for the forcibly controlled change in position of the transponder 36g exists e.g. when this change is effected by insertion of a screw into the associated fixing hole 16g (the transponder 36g is compressed by the screw or a threaded nut optionally mounted behind the fixing hole 16g). This pivoting motion takes place against the restoring force of a spring (not shown), which swings the displaced transponder 36g back into its starting position after demounting of the relevant built-in component.

Alternatively or additionally, to disable the RFID communication when inserting the fixing screw, in this exemplary embodiment the screening effect already described above due to an electrically conductive front plate of the relevant built-in component can also advantageously be used.

FIG. 15 shows an embodiment slightly modified relative to FIG. 14, in which a retaining section 60h provided for the pivot mounting is bent at its transponder-side end such that the front face of a transponder 36h fixed at this end projects somewhat out of an assigned fixing hole 16h of a mounting frame part 18h-1 toward the front. It is thereby possible e.g. to improve the quality of the RFID communication when the transponder 36h is not displaced.

FIG. 16 shows an exemplary embodiment in which a transponder 36i can again be forcibly pivoted over a retaining section 60i about a vertical pivoting axis 64i.

In contrast to the examples according to FIGS. 14 and 15 however, viewed in the transverse direction the undisplaced transponder 36i is not situated in the region of an assigned fixing hole 16i, but positioned closer to the centre of the device (between the frontal mounting frame parts), so that its forcible displacement (here: pivoting) is implemented by forcing the transponder 36i through a housing of a built-in component to be installed (also shown by a dashed line).

In a constructionally particularly simple manner the retaining section 60i can be implemented e.g. as a so-called film hinge, or perhaps as a permanently elastic plastic strip which is reversibly bent over when mounting a built-in component and therefore reverts to its initial shape on removal of the component.

With regard to the examples described with reference to FIGS. 14 to 16, it should be noted that their implementation is possible even when the relevant mounting frame part has no electromagnetic screening effect and is produced e.g. from non-screening plastic. In this case namely, it can be provided that the RFID communication is changed by the change in orientation of the device-specific RFID transponder which takes place in these examples. Means to be considered for this purpose are, for example, a suitably angle-dependent transmitting and/or receiving characteristic of the RFID transponder used, or a polarisation effect.

An alternative arrangement position of an RFID antenna 32i' is shown in dashed lines in FIG. 16, which only detects the transponder 36i when the built-in component is installed (and does not detect it when no built-in component is installed at the relevant position). Corresponding alternative (or additional) antenna arrangements (behind a mounting frame part) also follow e.g. from the examples according to FIGS. 14 and 15.

FIG. 17 shows an exemplary embodiment in which, similarly to the example according to FIG. 16, an arm 68j e.g. elastically hinged about a pivoting axis 66j is forced to pivot through a housing (shown by a dashed line) of a built-in component. In this case, via a mechanical functional connection 70j only schematically indicated, a transponder 36j displaceably mounted on a mounting frame part 18j-1 is pushed out through a lateral outer opening of the mounting frame part 18j-1. The functional connection in the illustrated exemplary embodiment can comprise e.g. a push rod between the arm 68j and the transponder 36j, or a holder for this transponder respectively.

In the above described exemplary embodiments with an RFID transponder that is displaceable during installation or removal of a built-in component, an operating device or an operating element could also alternatively be provided, which a user can activate manually when he or she mounts or demounts a built-in component.

In the following exemplary embodiments described with reference to FIGS. 18 and 19, such a manual operation is provided for the purpose of influencing the RFID communication. In these exemplary embodiments, as an alternative to the manual operation, a forcibly controlled or automatic displacement of a component could also be provided.

FIG. 18 shows an exemplary embodiment in which a device-specific RFID transponder 36k (e.g. separately from a mounting frame part) 18k-1 is held in a stationary position in the relevant receiving device. To achieve this the transponder 36k can be connected, e.g. via a retaining section, to another stationary part of the device (in the case of a cabinet, e.g. to an adjacent side wall).

As a manually activated operating element a screening plate 72k, implemented e.g. in the form of a slider, is provided which in a manner not shown in detail can be displaced in the direction of the double arrow in the Figure, such that by appropriate displacement of the screening plate 72k a user can optionally disable or enable communication between the transponder 36k and an assigned RFID antenna 32k. Unlike the illustrated exemplary embodiment, the transponder 36k could for this purpose also be arranged directly on the mounting frame part 18k-1, e.g. as shown in the example according to FIG. 13.

FIG. 19 shows an exemplary embodiment which is slightly modified with respect to the example of FIG. 18. A transponder 36m is again arranged in a stationary position in the region of a mounting frame part 18m-1 and can be optionally screened off or uncovered by a displacement of a screening plate 72m. The screening plate 72m is for this purpose pivotable about a vertical pivoting axis 74m (cf. double arrow).

FIG. 20 illustrates examples of further possibilities for the arrangement of device-specific RFID transponders 36n, 36p or 36q along a mounting frame part (e.g. vertical perforated strip) of the receiving device.

The transponders can be implemented e.g. in a known manner as adhesively attachable transponder strips with an integrated circuit ("transponder chip") and antenna sections protruding therefrom (e.g. in dipole fashion). In FIG. 20 the transponders 36n, 36p and 36q are each symbolised by such circuits complete with associated antenna sections.

To change the transponder action as a function of a presence or absence of a built-in component in the vicinity of the respective transponder, in the case of the illustrated transponders 36n and 36p the respective antenna sections can be short-circuited by direct contacting of these antenna sections by means of an electrically conductive front plate of the type described above. (The transponders and/or the front plate can be provided with e.g. spring contacts for the purpose, in order to guarantee a reliable contacting). In this case the screening action of such a front plate already described above can also be accompanied by influencing the antenna action (by short-circuiting of antenna sections).

In the case of the transponder 36q, the change in the transponder action can be based on a screening and/or electrical contacting of one of two antenna sections of the transponder 36q.

FIG. 21 shows an exemplary embodiment in which a device-specific RFID transponder 36r is arranged on the rear side of a "radio-signal transparent" (non-screening) strip 80r (e.g. made of plastic), which is inserted (e.g. screwed or glued) into a suitable recess of an e.g. metallic mounting frame part 18r-1. For communication with the transponder 36r, the RFID antenna 32r symbolised in FIG. 21 is provided.

When a built-in component (not shown) is mounted in the vicinity of the transponder 36r, then a forced pivoting of an arm 68r (see arrow) takes place, which is hinged against a spring force about a pivoting axis 66r. Due to this pivoting action, two electrical contacts on the side of the arm 68r facing the transponder 36r move out of electrical contact with electrical contacts correspondingly arranged on the rear side of the transponder 36r. In the illustrated example a short-circuit of the two electrical contacts of the transponder 36r, which is in the situation according to FIG. 21, is thereby removed. The forcibly pivotable arm 68r with the short-circuit contacts arranged thereon therefore represents an influencing means for signalling the presence or absence of a built-in component to the transponder 36r. The transponder 36r is implemented such that its transponder action (e.g. transferred data) is changed according to the above signalling.

FIG. 22 shows an exemplary embodiment which is slightly modified with respect to the example of FIG. 21. A transponder 36s is again arranged on the rear side of a non-screening strip 80s, wherein the transponder action thereof can again be changed by a pivoting of an arm 68s about a pivoting axis 66s.

In contrast to the example according to FIG. 21 the arm 68s is not however provided with electrical contacts for interaction with corresponding counter contacts of the transponder, but with an electrically conductive plate 72s, which depending on the pivot position of the arm 68s, is arranged either very near to the rear side of the transponder or somewhat at a distance away from it.

In this example the forced displacement of the plate 72s leads to an influence on the action of the antenna of the RFID transponder 36s. This change in the antenna action and thus transponder action can be provided such that in one case the communication with the RFID antenna 32s is enabled and in the other it is disabled.

The strips 80r and 80s provided in the examples according to FIGS. 21 and 22 can in particular be in the form of strips extending more or less continuously in the direction of the corresponding mounting frame part 18r-1 or 18s-1, which at the time of their installation or attachment to the mounting frame part, are already provided with a corresponding plurality of transponders 36r and 36s together with the assigned "influencing means" ("transponder strip").

The invention claimed is:

1. Receiving device, in particular a cabinet or rack,
having a receiving space (12) for receiving built-in components (14) provided with RFID transponders (34), having a detection device for detecting built-in components (14) accommodated, which is or can be connected to an evaluation device (30), and has at least one RFID antenna (32) for communication with the component-specific RFID transponders (34), and having a plurality of device-specific RFID transponders (36) arranged distributed along the receiving space (12), wherein the at least one RFID antenna (32) for communication with the component-specific RFID transponders (34) or at least one other antenna can be used or is provided for communication with the device-specific RFID transponders (36), and having influencing means for influencing the device-specific RFID transponders (36), such that the content of the communication of the device-specific RFID transponders (36) can be changed as a function of a presence or absence of a built-in component (14) in the vicinity of the respective device-specific RFID transponder (36), wherein the influencing means are each electrically connected or electrically connectable to an assigned one of the device-specific RFID transponders (36), such that the presence or absence is signalled to the respective device-specific RFID transponder (36), such that a detection of the mounting positions within the receiving space (12) is enabled.

2. The receiving device according to claim 1, wherein possible mounting positions of the built-in components (14) in the receiving space (12) are defined by a mounting grid of the receiving device (10), in particular by a mounting grid which is defined by the positions of a series of fixing means (16), constructed along a vertically extending mounting frame part (18).

3. The receiving device according to claim 1, wherein the device-specific RFID transponders (36) are arranged on a transponder grid extending along the receiving space (12), in particular on a transponder grid which is implemented so as to correspond to a mounting grid of the receiving device (10).

4. The receiving device according to claim 1, wherein the at least one RFID antenna (32) provided for communication with the component-specific RFID transponders (34) can also be used for communication with the device-specific RFID transponders (36).

5. The receiving device according to claim 1, wherein the detection device has at least one additional RFID antenna for communication with the device-specific RFID transponders (36).

6. The receiving device according to claim 1, wherein the change of the content of the communication of the device-specific RFID transponders (36) is effected forcibly by the installation or removal of a built-in component (14) in the vicinity of the respective device-specific RFID transponder (36).

7. The receiving device according to claim 1, wherein means for effecting the change in the transponder action are provided that can be manually operated by a user.

8. RFID detection method, carried out by means of a receiving device (10) according to claim 1.

9. The receiving device according to claim 1, wherein the RFID antenna (32) runs the length of the receiving device.

10. The receiving device according to claim 1, wherein the device-specific RFID transponders (36) are provided with electrical contacts, via which the presence or absence of a built-in component (14) in the vicinity of the respective device-specific RFID transponder (36) is signalled.

11. The receiving device according to claim 10, wherein the influencing means for influencing the device-specific RFID transponders (36r) each are formed by an arm (68r), which is hinged against a spring force about a pivoting axis (66r) and which is provided with short-circuit contacts arranged thereon, such that when a built-in component (14) is mounted in the vicinity of the respective device-specific RFID transponder (36r), a forced pivoting of the arm (68r) takes place and due to this pivoting action, two electrical contacts on the side of the arm (68r) facing the respective device-specific RFID transponder (36r) move out of electrical contact with the electrical contacts of the transponder (36r).

* * * * *